United States Patent [19]

Gulczynski

[11] Patent Number: 4,845,391
[45] Date of Patent: Jul. 4, 1989

[54] SWITCHING CIRCUITS PERFORMING THYRISTOR AND TRIAC FUNCTIONS

[76] Inventor: Zdzislaw Gulczynski, P.O. Box 441, Winchester, Mass. 01890

[21] Appl. No.: 53,635

[22] Filed: May 26, 1987

[51] Int. Cl.[4] .................. H03K 17/66; H03K 17/687; H03K 17/60
[52] U.S. Cl. .................... 307/631; 307/633; 307/254; 307/247.1; 307/571
[58] Field of Search .............. 307/253, 254, 255, 630, 307/631, 632, 638, 247.1, 570, 571

[56] References Cited

U.S. PATENT DOCUMENTS

| | | |
|---|---|---|
| 3,005,114 | 10/1961 | Martin et al. .................. 307/254 |
| 3,069,569 | 12/1962 | Singer et al. .................. 307/253 |
| 4,306,161 | 12/1981 | Sheinberg .................. 307/255 |

Primary Examiner—John Zazworsky

[57] ABSTRACT

The invention relates to fully controlled three-terminal switching power circuits having an extremely high switching speed and very low forward voltage. The switching circuits can perform thyristor and triac functions. They can be also turned on and off by a gate voltage of one polarity independently of polarity of anode voltage, and include one or two power transistors, preferably n-Ch MOSFETs. A switching circuit provides a connection between an anode and cathode in response to an input signal applied to a gate, and includes a transistor having a collector and emitter coupled respectively to the anode and cathode, and a base, a flip-flop having a signal input, reset input and output coupled to the gate, anode and base respectively, and a power supply for providing a supply voltage to the flip-flop.

18 Claims, 2 Drawing Sheets

SWITCHING CIRCUITS PERFORMING THYRISTOR AND TRIAC FUNCTIONS

CROSS REFERENCE TO RELATED APPLICATIONS

This application is related to: "High Power Switching Power Supply with High Power Factor" Ser. No. 304,508 filed 01/31/89; "High Power Switching Power Supply Having High Power Factor" Ser. No. 304,509 filed 01/31/89; "Power Switch Driver" Ser. No. 229,914 filed 08/08/88; "Synchronous Switching Power Supply" Ser. No. 229,915 filed 08/08/88; "Analog Power Amplifier" Ser. No. 180,432 filed 04/12/88; "High Efficiency Power Amplifier Comprising Multilevel Power Supply" Ser. No. 180,433 filed 04/12/88; "Switching Power Amplifier" U.S. Pat. No. 4,763,080 dated 08/09/88; "Switching Power Supply" U.S. Pat. No. 4,803,610 dated 02/07/89; "Power Amplifier" U.S. Pat. No. 4,782,306 dated 11/01/88; "Switching Power Supply" U.S. Pat. No. 4,736,286 dated 04/05/88; and "Push-Pull Power Amplifier" U.S. Pat. No. 4,476,441 dated 10/09/84. All inventions are by the same inventor.

BACKGROUND OF THE INVENTION

The invention generally relates to three-terminal switching power circuits performing functions of thyristors and triacs.

Thyristor, also known as SCR (silicon controlled rectifier), is a three-terminal unidirectional switching power device. The cathode is the reference terminal. The thyristor can be triggered by a low-level positive voltage applied to its gate if a positive voltage is applied to its anode. The thyristor is automatically turned off by reducing the anode voltage or reducing the principal current below a hold current.

Similarly, triac is a bidirectional switching power device. The triac can be triggered by a low-level voltage applied to its gate and having the same polarity as the voltage applied to its anode. It can be turned off under the same conditions as the thyristor.

A number of devices relating to thyristor and triac and similar in operation thereto is also available, e.g. PUT, SBS and UJT. A GTO (gate turn-off thyristor) is of interest as it can be turned off by an adequate gate voltage.

The thyristors and triacs are extremely slow. They also overwhelmingly require a high gate current. Furthermore, the forward voltage drop is relatively high due to the basic four layer structure. Triacs require the gate voltage having the same polarity as the anode voltage. The thyristors and triacs once triggered cannot be turned off by the gate control. The GTOs can be turned off by applying a gate voltage of an opposite polarity within a specific range and require a substantial reverse gate-drive current.

SUMMARY OF THE INVENTION

Accordingly, the present invention is intended to provide fully controlled three-terminal switching power circuits having an extremely high switching speed and very low forward voltage. They can be turned on and off by a gate voltage of one polarity.

A switching circuit according to the present invention provides a connection between an anode and cathode in response to an input signal applied to a gate, and includes a transistor having a collector and emitter coupled respectively to the anode and cathode, and a base, a flip-flop having a signal input, reset input and output coupled to the gate, anode and base respectively, and a power supply means for providing a supply voltage to the, flip-flop.

In another embodiment switching circuit includes a first diode coupled between the anode and the collector of the first said transistor to prevent reverse polarity currents thereof, a second transistor of the same conductivity type having a collector coupled to the cathode, and an emitter and base, a second diode coupled between the anode and the emitter of the second transistor to prevent reverse polarity currents thereof, a third transistor of an opposite conductivity type having a base, collector and emitter coupled to the cathode, base of the second transistor and output of the flip-flop respectively, and first and second comparator means, each exhibiting an offset voltage, coupled to receive a voltage appearing at one of the terminals of the first and second diodes respectively, for providing a comparison signal in accordance therewith to the reset input of the flip-flop.

In yet another embodiment switching circuit includes a first transistor of a first conductivity type having a base and emitter coupled to the gate and cathode respectively, and a collector, a first diode coupled between the anode and the collector of the first transistor to prevent reverse polarity currents thereof, a second transistor of the first conductivity type having a collector coupled to the cathode, and an emitter and base, a second diode coupled between the anode and the emitter of the second transistor to prevent reverse polarity currents thereof, and a third transistor of a second conductivity type having an emitter, base and collector coupled to the gate, cathode and the base of the second transistor respectively.

The present embodiments are characterized by an extremely high switching speed and thus are intended to operate in systems requiring a constant rather than an occasional switching, e.g. switching power supplies and switching power amplifiers. Similar devices in the circuits are used for positive and negative switching thus reducing cost and increasing overall performance.

BRIEF DESCRIPTION OF THE DRAWINGS

The present invention will become more clear in conjunction with the accompanying figures of which.

DETAILED DESCRIPTION OF THE INVENTION

Thyristors and triacs have three terminals: a cathode as the reference terminal, a gate and anode. An input signal is applied to the gate for setting up a connection between anode and cathode. A flip-flop controlling a transistor switch is employed for that purpose in the present embodiments. The flip-flop is triggered and reset by applying voltages or pulses to separate inputs thereof. A power supply is necessary for providing a supply voltage and current to the flip-flop. The power supply includes a capacitor which must be constantly charged to a voltage above the supply voltage of the flip-flop. However, a constant rather than an occasional switching is obvious in systems requiring a very fast switching, accomplished in the present embodiments. Furthermore, the capacitor network has an effect of a snubber. The present embodiments include one or two power transistors, preferably n-Ch MOSFETs.

Figure 1:
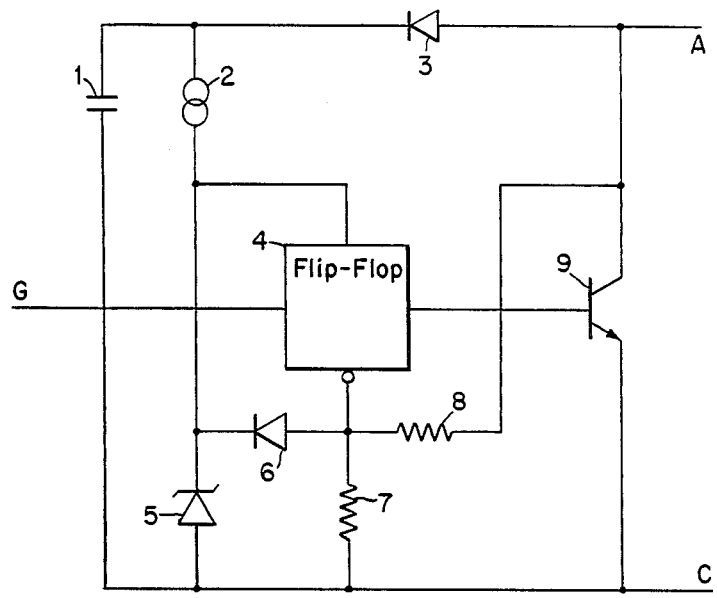
FIG. 1 is an embodiment of a thyristor circuit.

The thyristor circuit in FIG. 1 employs the flip-flop 4 providing the gate terminal and being triggered by a voltage applied thereto, independently of a voltage on its inverting reset input. The flip-flop 4 is referenced to the cathode and its power supply terminal obtains a supply voltage from a power supply means. The collector, emitter and base of the npn transistor 9 are coupled respectively to the anode, cathode and output of the flip-flop 4.

A positive voltage or a negative voltage of a small value can applied to the anode. The forward voltage is very low and is determined by a saturation voltage of the transistor 9. The circuit can be fully protected from a negative anode voltage by a diode coupled in series with the collector of the transistor 9, for conducting the collector current and preventing reverse polarity currents thereof. The resistor 8 can be coupled to the collector, or the anode which however requires a protection of the flip-flop reset input from negative voltages.

The reset input of the flip-flop 4 is coupled for sensing the anode voltage. If the anode and gate voltages are below predetermined values, the flip-flop 4 is reset. Moreover, the anode voltage is equal to the collector-emitter voltage of the transistor 9 and depends on the collector current thereof. Thus, the embodiment of FIG. 1 simulates all functions of a thyristor. Various types of flip-flops can be employed for accomplishing specific modes of operation and different from above.

The power supply means is coupled between anode and cathode for sensing and storing a substantially positive peak of the voltage appearing thereacross. It includes the diode 3 and capacitor 1 coupled in series between the anode and cathode respectively. A peak charging current of the capacitor 1 can be limited by a resistor or inductor coupled in series with the diode 3. The capacitor voltage is applied via the current source 2 to the zener diode 5 and thus reduced to the zener voltage thereof. This voltage is applied to a power supply terminal of the flip-flop 4. The current of the current source 2 is higher than the maximum output current of the flip-flop 4. The current source 2 can be replaced by a resistor. However, the employment of the current source results in a higher performance as the capacitor 1 is discharged by a predetermined current. Furthermore, the voltage across the zener diode 5 is more stable, also the power dissipation is reduced.

The anode voltage can be significantly higher than the supply voltage of the flip-flop 4. The voltage on the reset input thereof is limited by the diode 6 to approximately the zener voltage of the diode 5. The optional resistor 7 can have a high value and acts as a pull-down resistor to ensure the flip-flop reset even under adverse circuit conditions. The diode 5 can be replaced by a rechargeable battery, whereby the capacitor 1 is optional.

Figure 2:
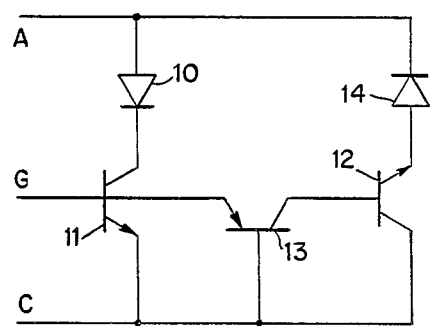
FIG. 2 is a basic structure of a bidirectional switch.

FIG. 2 is the basic structure of a bidirectional switch. The switch is fully controlled by a signal applied to the gate thereof. Moreover, it can be turned on and off by a gate voltage of one polarity independently of the polarity of anode voltage. For instance, the switch remains constantly closed by applying a positive gate voltage. The forward voltage is very low and is determined by a saturation voltage of a respective transistor and a forward voltage of a diode coupled thereto. The switching speed is very high.

The circuit comprises the npn transistor 11 with base and emitter coupled to the gate and cathode respectively. The diode 10 is coupled between the anode and the collector of the transistor 11 and prevents reverse polarity currents thereof. The collector of the npn transistor 12 is coupled to the cathode. The diode 14 is coupled between the anode and the emitter of the transistor 12 and prevents reverse polarity currents thereof. The pnp transistor 13 has emitter, base and collector coupled to the gate, cathode and the base of the transistor 12 respectively.

A positive voltage applied to the gate results in collector currents of the transistors 11 and 12 if the anode voltage is positive and negative respectively. All transistors must sustain peak voltages of respective polarities applied to anode. It shall be pointed out that the power transistors 11 and 12 are of the same conductivity type.

Figure 3:
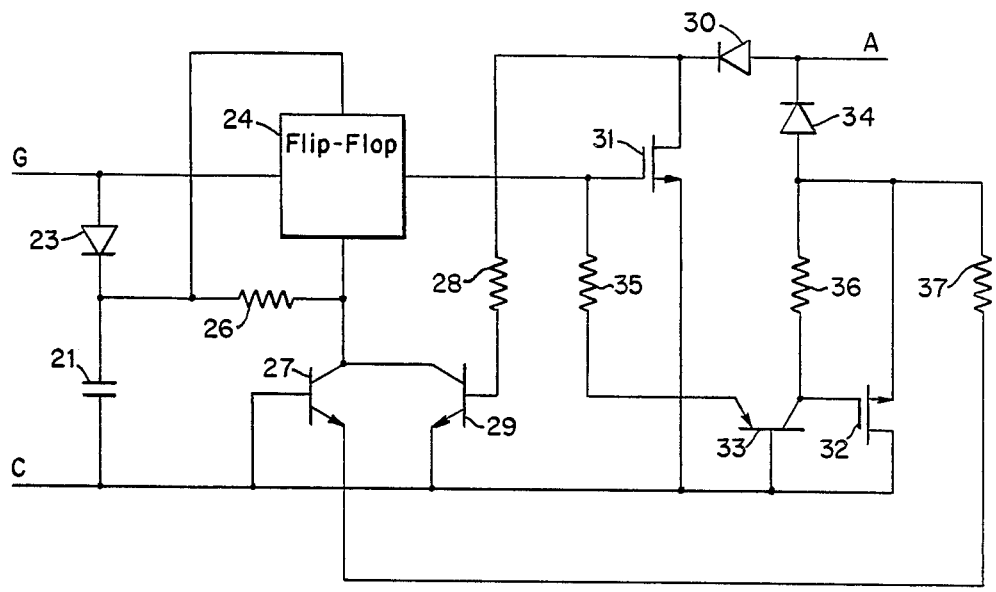
FIG. 3 is an embodiment of a triac circuit.

The triac circuit in FIG. 3 employs the flip-flop 24 providing the gate terminal and being triggered by a voltage applied thereto, independently of a voltage on its reset input. For instance, the circuit remains constantly turned on by applying a positive gate voltage independently of the anode voltage polarity. The output of the flip-flop 24 is coupled to a bidirectional transistor switch comprising the components 30 thru 36. The labels of the transistors and diodes 30 thru 34 refer to the likes respectively 10 thru 14 in FIG. 2.

Specifically, the circuit comprises the n-Ch MOSFET 31 with gate and source coupled to the output of the flip-flop 24 and cathode respectively. The diode 30 is coupled between the anode and the drain of the transistor 31 and prevents reverse polarity currents thereof. The n-Ch MOSFET 32 has drain coupled to the cathode. The diode 34 is coupled between the anode and the source of the transistor 32 and prevents reverse polarity currents thereof. The pnp transistor 33 has base, emitter and collector coupled to the cathode, the output of the flip-flop 24 via the resistor 35 and the gate of the transistor 32 respectively.

The resistor 36 is coupled between the gate and source of the transistor 32. The gate-source voltage of the transistor 32 will be substantially equal to the output voltage of the flip-flop 24, for a negative anode voltage, if the resistors 35 and 36 have equal values.

The anode voltage is sensed by a pair of transistors acting as comparator means and providing a reset signal to the flip-flop 24. The positive anode voltage is sensed by the transistor 29 having emitter and base coupled respectively to the cathode and the drain of the transistor 31 via the resistor 28. Similarly, the negative anode voltage is sensed by the transistor 27 having base and emitter coupled respectively to the cathode and the source of the transistor 32 via the resistor 37. The collectors of the transistors 29 and 27 are tied together and coupled to the reset input of the flip-flop 24.

Actually, the anode voltage sensed by the transistors 29 and 27 is higher due to a forward voltage of the diodes 30 and 34 respectively. The transistors 29 and 27 are employed as comparators exhibiting offset voltages equal to the their base-emitter voltages. These voltages are compared with the drain-source voltages of the transistors 31 and 32 respectively. By these means the amount of current flowing between the anode and cathode can be determined. If the gate voltage is below a predetermined value and the absolute value of the anode voltage is below the offset voltage of the respective transistor 29 or 27, the flip-flop 24 is reset. Various types of flip-flops can be employed for accomplishing specific modes of operation and different from above.

The offset voltages of the transistors 29 and 27 can be decreased below their base-emitter voltages. For instance, the voltage of the capacitor 21 can be applied via a resistor and via a voltage divider to the bases of the transistors 29 and 27 respectively.

For higher accuracy more complex transistor circuits such as differential amplifiers and comparators can be used as comparator means. Each of these circuits has a reference and signal inputs. The reference inputs receive voltages which can derive from voltage dividers reducing the voltage of the capacitor 21, and which determine offset voltages of the comparator means. The signal inputs can be protected from reverse input voltages by diodes coupled in parallel therewith, and then coupled to the anode via separate resistors. However, the current flowing between the anode and cathode can be more accurately determined by sensing the drain-source voltages of the transistors 31 and 32 as MOSFETs have approximately linear on-resistance.

The power supply means is coupled between gate and cathode for sensing and storing a positive peak of the voltage appearing thereacross. It includes the diode 23 and capacitor 21 coupled in series between the gate and cathode respectively. The capacitor voltage is applied to a power supply terminal of the flip-flop 24 as well as to the reset input thereof via the pull-up resistor 26. A peak charging current of the capacitor 21 can be limited by a resistor or inductor coupled in series with the diode 23. The peak voltage of the capacitor 21 can be limited by a zener diode coupled in parallel therewith. The capacitor 21 can be replaced by a rechargeable battery.

The above embodiments can be carried out in integrated form as three-terminal devices. A fast switching allows a small value of the capacitor 1 or 21. A fourth terminal can be established for the capacitor or the power supply terminal of the flip-flop 4 or 24.

The embodiments of the present invention described herein are intended to be taken in an illustrative and not a limiting sense. Various modifications and changes may be made to these embodiments by persons skilled in the art without departing from the scope of the present invention as defined in the appended claims.

What I claim is:

1. Switching circuit for providing a connection between an anode and cathode in response to an input signal applied to a gate, comprising:
   a transistor having a collector and emitter coupled respectively to the anode and cathode, and a base;
   a flip-flop having a signal input, reset input and output coupled to the gate, anode and base respectively; and
   a power supply means for providing a supply voltage to the flip-flop.

2. Switching circuit of claim 1, wherein the power supply means is coupled between the anode and cathode for sensing a voltage appearing thereacross.

3. Switching circuit of claim 2, wherein the power supply means is storing a substantially peak voltage appearing between the anode and cathode.

4. Switching circuit of claim 3, wherein the power supply means includes a diode and a capacitor coupled in series and means coupled to the capacitor for providing the supply voltage of the flip-flop.

5. Switching circuit of claim 4, wherein the means for providing includes a zener diode and a current source means coupled for providing a current to the zener diode, with the supply voltage of the flip-flop appearing thereacross.

6. Switching circuit of claim 1, wherein the power supply means is coupled between the gate and cathode for sensing a voltage appearing thereacross.

7. Switching circuit of claim 6, wherein the power supply means is storing a substantially peak voltage appearing between the gate and cathode.

8. Switching circuit of claim 7, wherein the power supply means includes a diode and a capacitor coupled in series, with the supply voltage of the flip-flop appearing across the capacitor.

9. Switching circuit of claim 1, further including a diode coupled in series with the collector of the transistor for preventing reverse currents thereof, wherein the reset input of the flip-flop is coupled to one of the terminals of the diode.

10. Switching circuit of claim 1, further including a resistor coupled in series with the reset input of the flip-flop.

11. Switching circuit of claim 10, further including a diode coupled to limit any voltage appearing at the reset input of the flip-flop to approximately the supply voltage thereof.

12. Switching circuit of claim 1, wherein the first said transistor is of a first conductivity type, and further comprising:
   a first diode coupled between the anode and the collector of the first said transistor to prevent reverse polarity currents thereof;
   a second transistor of the first conductivity type having a collector coupled to the cathode, and an emitter and base;
   a second diode coupled between the anode and the emitter of the second transistor to prevent reverse polarity currents thereof;
   a third transistor of a second conductivity type having a base, collector and emitter coupled to the cathode, base of the second transistor and output of the flip-flop respectively; and
   first and second comparator means, each exhibiting an offset voltage, coupled to receive a voltage appearing at one of the terminals of the first and second diodes respectively, for providing a comparison signal in accordance therewith to the reset input of the flip-flop.

13. Switching circuit of claim 12, further including a resistor coupled for providing the supply voltage of the flip-flop to the reset input thereof.

14. Switching circuit of claim 12, further including a resistor coupled between the base and emitter of the second transistor.

15. Switching circuit of claim 12, further including a resistor coupled in series with the emitter of the third transistor.

16. Switching circuit for providing a connection between an anode and cathode in response to an input signal applied to a gate, comprising:
   a first transistor of a first conductivity type having a base and emitter coupled to the gate and cathode respectively, and a collector;
   a first diode coupled between the anode and the collector of the first transistor to prevent reverse polarity currents thereof;

a second transistor of the first conductivity type having a collector coupled to the cathode, and an emitter and base;
a second diode coupled between the anode and the emitter of the second transistor to prevent reverse polarity currents thereof; and
a third transistor of a second conductivity type having an emitter, base and collector coupled to the gate, cathode and the base of the second transistor respectively.

17. Switching circuit of claim 16, further including a resistor coupled between the base and emitter of the second transistor.

18. Switching circuit of claim 16, further including a resistor coupled in series with the emitter of the third transistor.

* * * * *